Nov. 2, 1965 J. R. MOSER ETAL 3,215,856

TIME DELAY CIRCUIT

Filed Nov. 2, 1962

INVENTORS
JOSEPH R MOSER
MANFRED E. NEUMANN
RONALD E. POLLARD

BY Thomas O. Klaiber

ATTORNEY

United States Patent Office 3,215,856

Patented Nov. 2, 1965

3,215,856

TIME DELAY CIRCUIT

Joseph R. Moser, Brookfield, Manfred E. Neumann, Waukesha, and Ronald E. Pollard, Milwaukee, Wis., assignors to Allen-Bradley Company, Milwaukee, Wis., a corporation of Wisconsin Filed Nov. 2, 1962, Ser. No. 235,057

2 Claims. (Cl. 307—88.5)

Figure 1:
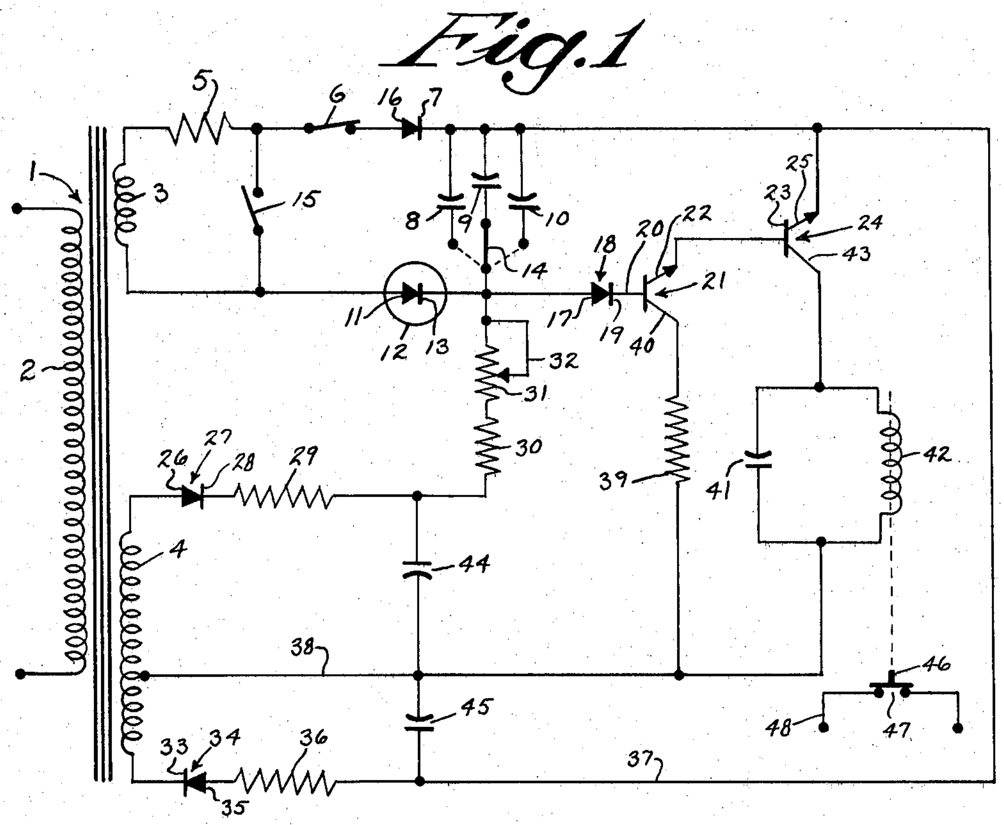

This invention relates to a time delay circuit containing a time delay capacitor, a reverse biasing circuit including said time delay capacitor, a reverse biasing potential and means for electrically isolating said reverse biasing potential source from said time delay capacitor to initiate a timing operation; a discharge circuit including said time delay capacitor, a discharge potential source and means for controlling the discharge circuit's time constant; and a current gate connected to be triggered by said capacitor.

Time delay circuits, including the present invention, are essential elements in timing relays and the like. Such timing relays have application in a wide variety of devices; for example, welding controls, conveyor controls, material handling, machine tool controls, elevators, logic circuit controls, and many others. Different mechanisms may be used to create time delays, but for critical industrial applications, electronic timers are commonly used because of their versatility, controllability and precision operation. Electronic timers usually employ the charge or discharge time of a capacitor to effect the time delay by connecting thyratron tubes, semi-conductor devices or other types of current gates to be triggered by a predetermined state of charge on the capacitor to permit the flow of an output current. Hence, the rate at which the capacitor can be made to charge or discharge can determine the time delay provided by the circuit.

However, electronic time delay circuits of the prior art frequently manifested an undesirable sensitivity to fluctuations in ther voltage supplies, resulting in excessive timing error. Moreover, the time delay circuits utilized in the prior art timing devices presented limited timing ranges for any given model, so that a series of models had to be produced to cover the demand for various timing capabilities. In addition, the adjustability for all models and ranges of timing circuits was not uniformly precise and accurate.

The present invention eliminates many of the disadvantages of the prior art by its ability to perform the entire timing operation for any predetermined time delay within the period of one time constant of a time delay capacitor circuit. Hence, any time delay effected by a circuit embodying the present invention utilizes only the most linear portion of the time delay capacitor charging curve. As a result, greater timing accuracy may be achieved. Moreover, a timing circuit embodying the present invention is almost completely insensitive to fluctuations in its supply voltage.

Those advantages are achieved by the use of separate potential sources of constant ratio to each other, one for placing a reverse bias charge on the time delay capacitor, and the other for discharging the reverse bias charge. By "reverse bias charge" is meant any charge on the capacitor which will trigger a current gate in an output circuit to interrupt that output circuit. As a result of the use of two independent potential sources, the entire timing operation can be accomplished within a single time constant of the capacitor's discharge circuit. With such an arrangement, for a given time constant, the timing operation may depend only upon the ratio of the reverse biasing source potential and the discharge source potential. Hence, the timing operation is wholly independent of the amplitude of the voltage supply, and therefore immune from its fluctuations.

Accordingly, it is an object of the present invention to provide a highly accurate time delay circuit.

It is another object of the present invention to provide a time delay circuit which has a broad timing range and which may be accurately adjusted throughout its timing range.

It is another object of the present invention to provide a versatile time delay circuit.

It is another object of the present invention to provide a time delay circuit wherein the timing operation is independent of the supply voltage amplitude and hence immune from voltage fluctuations.

It is another object of the present invention to provide a time delay circuit which can accomplish its timing function within the period of one time constant of its RC circuit.

The foregoing and other objects will appear in the description to follow. In the descripiton, reference is made to the accompanying drawing which forms a part hereof and in which there is shown by way of illustration a specific embodiment in which this invention may be practiced. This embodiment will be described in sufficient detail to enable those skilled in the art to practice this invention, but it is to be understood that other embodiments of he invention may be used and that structural changes may be made in the embodiment described without departing from the scope of the invention. Consequently, the following detailed description is not to be taken in a limiting sense; instead, the scope of the present invention is best defined by the appended claims.

Figure 2:
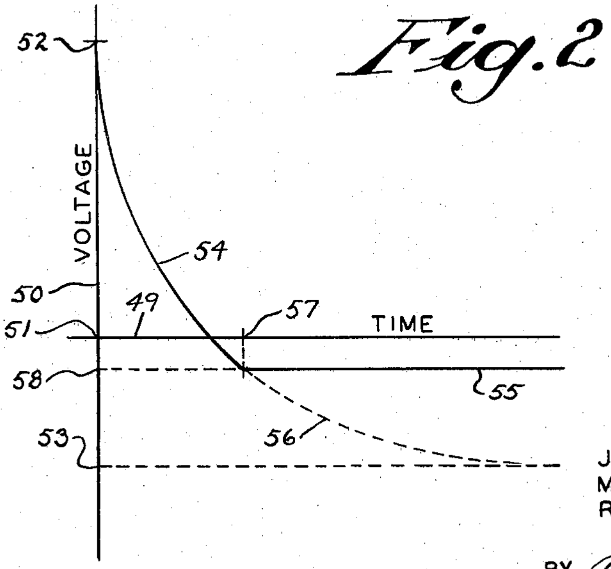

In the drawings:

FIG. 1 is a schematic wiring diagram of a preferred embodiment of the present invention, FIG. 2 is an illustrative graph of a forward charging curve for a time delay capacitor used in an embodiment of the present invention.

Referring now specifically to the drawings, in FIG. 1 a supply voltage transformer 1 has its primary 2 connected across an A.C. supply voltage source (not shown). The supply voltage transformer 1 has two secondary windings, a reverse bias secondary 3 and a tapped discharge secondary 4. The reverse bias secondary 3 has its positive end connected through a current limiting resistor 5, a normally closed actuator switch 6 and a rectified diode 7 to one side of the three, alternative, time delay capacitors 8, 9 and 10. The negative end of the reverse biasing secondary 3 is connected to an anode 11 of a zener diode 12, which has its cathode 13 connected to a selector switch 14. The selector switch 14 is adapted to contact the opposite side of any one of the three time delay capacitors 8, 9 or 10. A normally open actuating switch 15 is connected across the reverse biasing secondary 3 between the current limiting resistor 5 and an anode 16 of a rectifier diode 7 to a point between the opposite side of the reverse biasing secondary 3, and the anode 11 of the zener diode 12. The above described circuit constitutes a reverse biasing circuit for the time delay capacitor 8, 9 or 10.

The reverse bias charge thus built upon the time delay capacitor 8, 9 or 10 is made to appear across a control of a current gate, to be described. The selector switch 14 in the reverse bias circuit is connected to an anode 17 of a protective diode 18, which has its cathode 19 connected to a base 20 of an NPN type amplifier transistor 21. The amplifier transistor 21 has its emitter 22 connected to a base 23 of an NPN type output transistor 24, so that the two transistors 21 and 24 are cascaded. An emitter 25 of the output transistor 24 is connected back to the time delay capacitors 8, 9 and 10. Hence, the transistors 21 and 24 which function as the current gate in this embodiment, both have their emitter junctions, which control their operation, connected across the time delay capacitors 8, 9 or 10.

A discharge circuit for the time delay capacitors 8, 9 and 10 is formed across the tapped discharge secondary 4 of the supply voltage transformer 1. The positive end of the discharge secondary 4 is connected to an anode 26 of a rectifier diode 27, which has its cathode 28 connected through a filter resistor 29 and a minimum time delay resistor 30 to one end of a timing control rheostat 31. The timing control rheostat 31 has its other end and its slider 32 connected to the selector switch 14. The discharge secondary 4 has its negative end connected to a cathode 33 of a rectifier diode 34, which has its anode 35 connected through a filter resistor 36 to a lead wire 37. The lead wire 37 is connected to the emitter 25 of the output transistor 24. Hence, the discharge secondary 4 is connected across the time delay capacitors 8, 9 or 10, since its positive end is connected to the selector switch 14 through the elements described above, and its negative end is connected to the time delay capacitors 8, 9 and 10.

An output current circuit is energized by a portion of the charging secondary 4 by means of its tap 38. The tap 38 is connected through a stablizing resistor 39 to a collector 40 of the amplifier transistor 21, completing the transistor's 21 circuit. The tap 38 is also connected through a transient suppressor capacitor 41 and an output relay coil 42 connected in parallel to a collector 43 of the output transistor 24. The output current circuit is completed through the output transistor 24, the lead wire 37, filter resistor 36, and rectifier diode 34 back to the negative end of the tapped discharge secondary 4.

L-type filters in the discharge secondary's 4 circuit are completed by a filter capacitor 44 between the center tap 38 and on end of the filter resistor 29 at the positive end of the secondary 4, and a second filter capacitor 45, which is connected between the tap 38 and the filter resistor 36 in the negative end of the secondary 4. An output relay armature 46 is shown across normally closed contacts 47 in a controlled circuit 48. Of course, the armature 46 could as well perform a variety of different functions, and, for that matter, the output current may operate devices (not shown) other than the output relay coil 42.

The operation of the above described time delay circuit may be visually represented by a graph, such as FIG. 2. In that graph, an abscissa 49 represents time, and an ordinate 50 represents the voltage impressed upon the time delay capacitor 9. An origin 51, where the abscissa 49 and ordinate 50 intersect, is chosen which represents on the abscissa 49 the point in time when the reverse biasing circuit is isolated from the time delay capacitor 9 to initiate the timing, and which, on the ordinate 50, represents the potential of the base 20 of the amplifier transistor 21. On the ordinate 50, a point 52 represents the value of the peak reverse biasing charge normally built up on the time delay capacitor 9, and a point 53 represents the value of the negative end of the tapped discharge secondary 4. The discharge of the time delay capacitor 9 is represented by the solid line curve 54, which begins at the peak reverse bias point 52 on the ordinate 50, and, in time, it slopes downward until it terminates in line 55, which represents the charge on the time delay capacitor 9 when the output transistor 24 is conducting. A broken line curve 56, which begins at the intersection of the discharge curve 54 and the line 55, represents the normal completion of the discharge of the capacitor 9 if the current gate were removed from the circuit. A broken line 57 vertically intersecting the abscissa 49 represents a time constant of the RC circuit including the time delay capacitor 9. The potential of the emitter 25 of the output transistor 24, when that transistor 24 is conducting, is represented by a point 58 on the ordinate 50, which point 58 is negative relative to the origin 51.

In terms of function, at time 0, the charge on the capacitor 9 and the potential of the emitter 25 is at its peak reverse bias point 52 on the ordinate 50, and the timing operation may be initiated. The capacitor 9 discharges along the curve 54 until one time constant 57 has expired, when the potential of the emitter 25 has reached a point 58 sufficiently negative with respect to the potential of the base 20, represented by the origin 51 and abscissa 49, and that the two cascaded transistors 21 and 24 will conduct. When the transistors 21 and 24 conduct, the charge 55 on the capacitor 9 remains constant. The increment between the origin 51 and the point 58 on the ordinate 50 represents the forward bias potential difference between the bases 20 and 23 and emitters 22 and 25 of the transistors 21 and 24 required to make those transistors 21 and 24 conduct.

The reverse bias charge on the capacitor 9, represented by the point 52 on the ordinate 50 in FIG. 2, is built up through a reverse biasing circuit which has the secondary winding 3 as its most immediate voltage source. In the present embodiment, the reverse biasing charge 52 across the reverse bias secondary 3 is preferably set at around 60 volts. The reverse bias charging current flows from the positive side of the secondary 3, through the current limiting resistor 5, the normally closed actuator switch 6 and the rectifier diode 7 to one side of the time delay capacitors 8, 9 and 10. The reverse bias charging circuit is completed through the selector switch 14 and the zener diode 12, which has an appropriate zener voltage characteristic to pass the charging current. The reverse bias charge thus built up on the time delay capacitor 9 is simultaneously imposed across the bases 20 and 23 and emitters 22 and 25 of the amplifier transistor 21 and the output transistor 24. Hence, the emitter-base junctions of those two NPN type transistors 21 and 24 are reversely biased and the transistors 21 and 24, functioning as a current gate, are non-conducting. That is the normal condition of the time delay circuit of the present embodiment.

The timing operation may be initiated by isolating the reverse biasing secondary 3 from the time delay capacitor 9, either by closing the normally open actuating switch 15, or opening the normally closed actuating switch 6. If the normally open switch 15 is closed, the secondary 3 will be shorted out of the circuit, and the rectifier diode 7 and zener diode 12 will isolate the time delay capacitor 9 from the shunt path formed through the actuating switch 15. If the normally closed actuating switch 6 is open, the reverse biasing circuit will be open.

When the reverse biasing secondary 3 has been isolated from the time delay capacitor 9, the capacitor 9 will begin to discharge its reverse bias charge through the discharge circuit. Discharge current flows from the positive end of the tapped discharge secondary 4 through the rectifier diode 27, the filter resistor 29, the minimum time delay resistor 30, part of the timing control rheostat 31 to a slider 32, and hence to the time delay capacitor 9. In the embodiment illustrated in the drawing the potential across the charging secondary 4 may be set at about 33 volts, 22 volts from the tap 38 to the positive end of the charging secondary 4, and 11 volts from its negative end to the tap 38. The reverse bias charge on the time delay capacitor 9 will flow from the capacitor 9 to the lead wire 37 and hence through the filter resistor 36 and the rectifier diode 34 to the negative end of the tapped discharge secondary 4. So long as a reverse bias charge is on the capacitor 9, the protective diode 18 will bar its discharge through the transistors 21 and 24, which discharge might otherwise break down the transistors 21 and 24.

The time delay capacitor 9 is sufficiently discharged to present a forward bias across the emitter-base junctions of the transistors 21 and 24, the amplifier transistor 21 and the output transistor 24 will begin conducting. When the transistors 21 and 24 begin conducting, the charge current will pass from the slider 32 of the rheostat 31 through the protective diode 18, the base 20 and emitter 22 of the amplifier transistor 21 and the base 23 and emitter 25 of the output transistor 24 to the lead wire 37, and hence complete the circuit to the charging secondary 4 as described above.

In other words, when the transistors 21 and 24 are sufficiently forward biased to conduct, the discharge current becomes base current for the amplifier transistor 21. Collector current will flow from the tap 38 of the charging secondary 4, through the stabilizing resistor 39, and the collector 40, base 20 and the emitter 22 of the amplifier transistor 21, to provide base current to the output transistor 24.

Base current for the output transistor 24 will flow from the emitter 22 of the amplifier transistor 21 through the base 23 of the output transistor 24 to the emitter 25 of the transistor 24 and the lead wire 37 return to the secondary 4. When base current flows in the output transistor 24, output current will flow from the tap 38 of the secondary 4, through the output relay winding 42, and the collector 43 of the output transistor 24, across its base 23 and out through its emitter 25 to the lead wire 37 and back to the negative end of the tapped discharge secondary 4.

When output current flows through the output relay coil 42, energizing it, the armature 46 will be actuated, opening the controlled circuit 48. A transient current suppressor capacitor 41 is connected in parallel with the relay coil 42 to eliminate, as far as practically possible, the effect of transients on the effectiveness of the output relay coil 42. Also, a pair of filter capacitors 44 and 45 between the tap 38 and the two filter resistors 29 and 36, respectively, complete common L-type filter networks to provide high quality unidirectional output from the tapped secondary 4.

When the secondaries 3 and 4 develop the potentials indicated, the reverse bias built upon the time delay capacitor 9 will be slightly less, as a result of circuit losses, than that portion of the charge that can be removed within one time constant 59 of the forward charging circuit. When the reverse bias charge 55 is added to that forward bias charge 57 required to permit the current gate to conduct, the sum will approximate 63.2% of the total charge which the charging circuit would be capable of supplying to the reversely biased time delay capacitor 9. Hence, the timing operation is performed within one time constant 59 of the forward charging circuit. Since the point at which the current gate will conduct, viz., at which transistors 21 and 24 conduct, will remain constant, the time delay circuit can be made to function in more or less than one time constant 59 of the forward charging circuit by increasing or decreasing the reverse bias potential 55 across secondary 3 with respect to the potential 58 across the tapped discharge secondary 4. However, since it is that ratio of voltages developed across the secondaries 3 and 4 which determines the time delay, the operation of the time delay circuit remains independent of fluctuations in the sum of the voltages across the secondaries 3 and 4 and, hence, independent of fluctuations in the supply voltage imposed across the primary 2.

By adjusting the slider 32 of the rheostat 31, the resistance in the discharge circuit may be varied so as to vary the time constant of the circuit. Also, by selecting either of the other two time delay capacitors 8 or 10, the capacitance in the discharge circuit may be varied to change the circuit's time constant. Hence, when the ratios of the voltages developed across the secondaries 3 and 4 and the position of the tap 38 have been fixed, the time delay of the entire circuit may be varied precisely through a wide range, while the time delay is always completed at the predetermined, immutable, precise point established by those ratios on the total discharge curve 54, preferably at one time constant 59.

We claim:

1. In a time delay circuit, the combination comprising:

a capacitor charging transformer having a primary winding connected across an alternating current source and at least two secondary windings;

a controllable current gate in series connection with an output device and an output current source, and having a control element controlling the conductivity of said current gate responsive to an electrical signal imposed thereon;

a time delay capacitor having one side connected to said control element whereby the conductivity of said current gate may be controlled by an electrical signal in said capacitor;

a first secondary winding of said transformer being connected through rectifier means and a switch across said time delay capacitor to charge said capacitor so as to bias said current gate to nonconductive condition when said switch is closed;

and a second secondary winding of said transformer being connected through rectifier means and a time constant control resistance across said time delay capacitor with such polarity so as to provide a discharge path for a reverse bias charge on said capacitor and to complete a circuit for said electrical signal imposed on said control element of said current gate.

2. A time delay circuit according to claim 1 wherein said second secondary winding is tapped and has one portion connected in series with said output device and current gate to serve as said output current source.

References Cited by the Examiner

UNITED STATES PATENTS 3,032,714 5/62 Cohen ............... 307—88.5

ARTHUR GAUSS, *Primary Examiner.*